United States Patent [19]
Banno et al.

[11] Patent Number: 5,294,862
[45] Date of Patent: * Mar. 15, 1994

[54] LADDER-TYPE PIEZO-ELECTRIC FILTER

[75] Inventors: Hisao Banno; Yasuhiko Nakagawa, both of Aichi, Japan

[73] Assignee: NGK Spark Plug Co., Ltd., Aichi, Japan

[*] Notice: The portion of the term of this patent subsequent to Dec. 1, 2009 has been disclaimed.

[21] Appl. No.: 913,702

[22] Filed: Jul. 16, 1992

[30] Foreign Application Priority Data

Jul. 18, 1991 [JP] Japan ................................. 3-204022

[51] Int. Cl.$^5$ ...................... H03H 9/205; H01L 41/08
[52] U.S. Cl. ..................... 310/366; 310/359; 333/189
[58] Field of Search ................. 310/359, 366; 29/25, 29/35; 333/187–192

[56] References Cited

U.S. PATENT DOCUMENTS

| | | | |
|---|---|---|---|
| 3,916,490 | 11/1975 | Sheahan et al. | 20/25.35 |
| 4,287,493 | 9/1981 | Masaie | 333/189 |
| 4,451,753 | 5/1984 | Ogawa et al. | 310/315 |
| 5,077,544 | 12/1991 | Ogawa et al. | 333/189 |
| 5,168,253 | 12/1992 | Nakagawa et al. | 333/189 |

FOREIGN PATENT DOCUMENTS 129840 2/1977 Fed. Rep. of Germany ...... 333/189

Primary Examiner—Emanuel T. Voeltz
Assistant Examiner—C. LaBalle
Attorney, Agent, or Firm—Finnegan, Henderson, Farabow, Garrett & Dunner

[57] ABSTRACT

In radio communication equipment, a ladder-type piezo-electric filter is provided which operates in a high-frequency region of approximately 1.7 MHz–2 MHz. The filter is smaller than conventional ladder-type electric filters, less costly, and more easily handled and produced. In accordance with the present invention, rectangular piezo-resonators that longitudinally generate harmonic oscillation are used in the series and parallel branches of a ladder-type circuit. In each resonator, piezo-electric regions are formed by dividing surface electrodes with isolating slits. The slits are formed at the positions corresponding to the node points of the harmonic oscillation waveforms. For the piezo-resonators placed in the series branches of the ladder-type circuit, the piezo-electric regions are polarized in the same transverse direction. In each piezo-resonator used in a parallel branch, the piezo-electric regions are polarized in alternately opposite transverse directions. In addition, the divisional electrodes of the parallel branch piezo-resonators are bridged over with a suitable conductor, such as conductive paint, or the like.

10 Claims, 6 Drawing Sheets

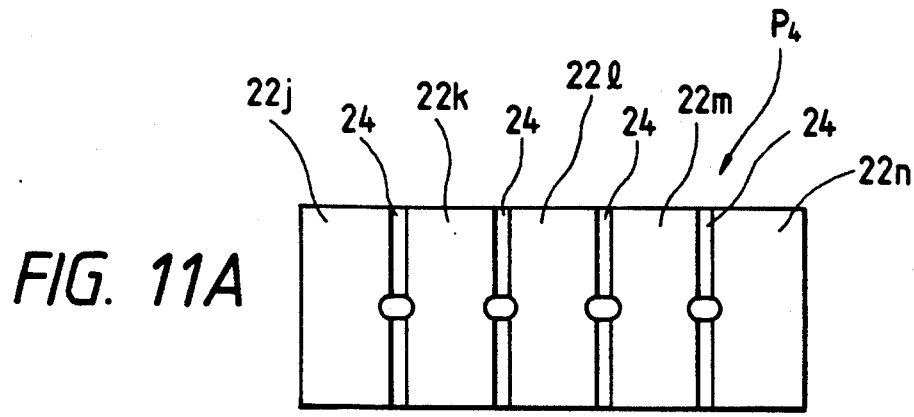
FIG. 11A
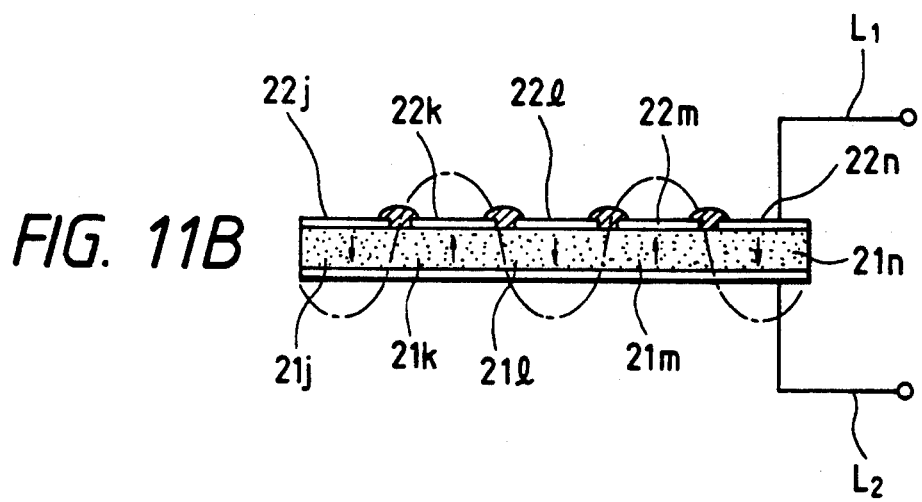
FIG. 11B
FIG. 12
PRIOR ART
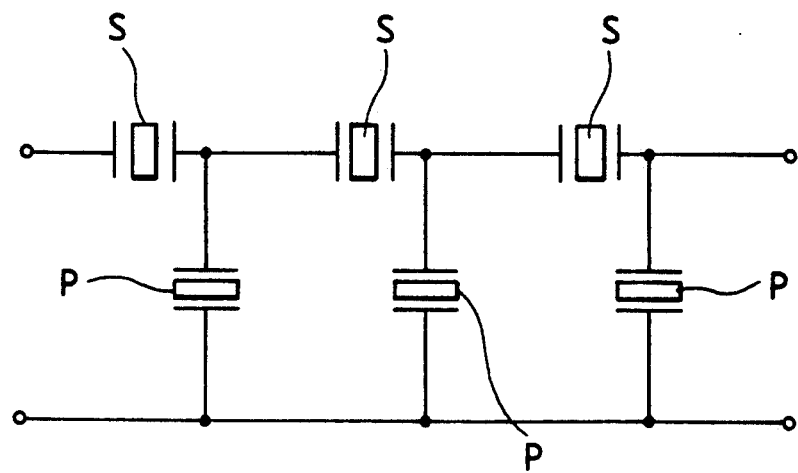

LADDER-TYPE PIEZO-ELECTRIC FILTER

BACKGROUND OF THE INVENTION

1. Field of the Invention

The present invention generally relates to a filter circuit for use in radio communication equipment, such as portable mobile radio equipment, a mobile telephone system, a cordless telephone, or the like, and particularly relates to a ladder-type piezo-electric filter to be used in a high-frequency region not lower than 1 MHz.

2. Discussion of the Related Art

Conventionally, ladder-type electric filters for radio communication equipment have been designed to operate with a center frequency of 455 kHz. As shown in FIG. 12, such a filter typically has a configuration in which piezo-resonators S, with resonance frequency at 455 kHz, and piezo-resonators P, with antiresonance frequency at 455 kHz, are inserted into series and parallel branches of a ladder-type circuit. Each piezo-resonator has a pair of electrodes placed respectively on the front and back surfaces of a square piezo-electric ceramic element. This filter, however, has the disadvantage that its size is large, as each of the piezo-resonators occupies an area of about 5 mm square.

To eliminate this disadvantage, a filter has been proposed which uses piezo-resonators that generate longitudinal harmonic oscillation. Each piezo-resonator has a pair of opposite electrodes placed respectively on the front and back surfaces of a rectangular piezo-electric ceramic element. Because its longitudinal or transverse size is at most 7/10 that of the square piezo-resonator, this filter has the advantages of a smaller size, a reduction in the amount of piezo-electric material used, and a lower production cost.

For the radio communication equipment of mobile telephone systems, there is a demand for a ladder-type piezo-electric filter of decreased size and capability of operating in a high-frequency region of approximately 1.7 MHz–2 MHz. Such a filter requires resonators of small dimension in both the longitudinal and transverse directions and, from the viewpoints of production and handling, is difficult to realize.

SUMMARY OF THE INVENTION

The present invention has been made in view of the above circumstances and has as an object to provide a small-sized ladder-type piezo-electric filter which is easily produced and which operates in a high-frequency region.

A further object of the present invention is to provide a filter improved in spurious characteristic.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the ladder-type piezo-electric filter, of this invention comprises rectangular piezo-resonators utilizing longitudinal high harmonic oscillation inserted in the series and parallel branches of the circuit. In each piezo-resonator, one of or both of the opposite electrodes are divided into a certain number of divisional opposite electrodes so as to generate predetermined high harmonic oscillation. The resultant piezo-electric regions, which are sectioned off by the divided opposite electrodes, are polarized. In the piezo-resonators that are inserted in the series branches, the piezo-electric regions are polarized in the same direction. For those inserted in the parallel branches, the regions are alternately reversely polarized and the divisional electrodes are bridged over with conductors.

BRIEF DESCRIPTION OF THE DRAWINGS

The accompanying drawings, which are incorporated in and constitute part of this specification, illustrate embodiments of the invention and, together with the description, serve to explain the objects, advantages and principles of the invention. In the drawings.

FIGS. 11A and 11B are plan and cross-section views showing a rectangular piezo-resonator which is to be inserted into a parallel branch of the ladder-type circuit of FIG. 1 and which utilizes a five-times harmonic of longitudinal oscillation; and FIG. 12 is a diagram showing the circuit of the conventional ladder-type piezo-electric filter.

DETAILED DESCRIPTION OF THE PREFERRED EMBODIMENTS

Figure 1:
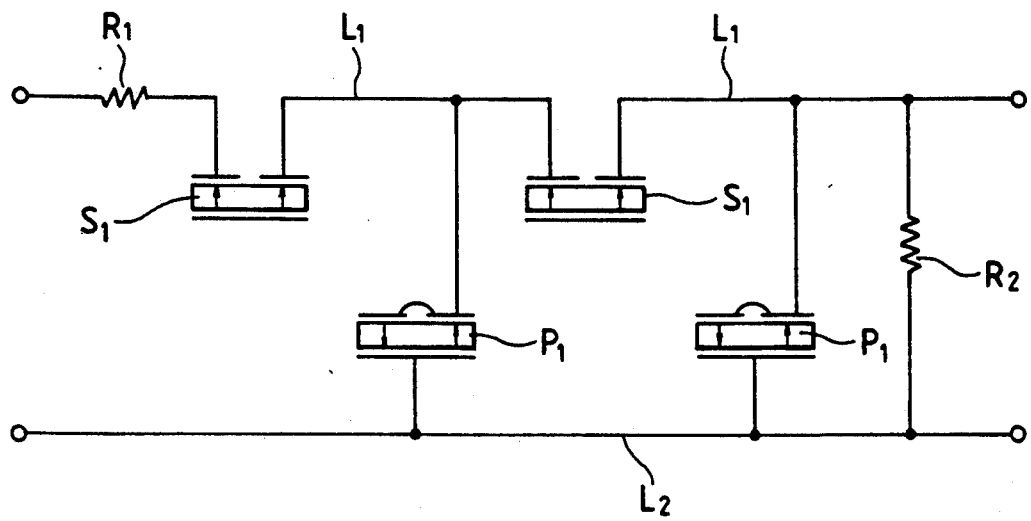
FIG. 1 is a circuit diagram showing a ladder-type piezo-electric filter according to an embodiment of the present invention.

In FIG. 1, a piezo-electric filter according to the present invention is shown in which rectangular piezo-resonators $S_1$ and $P_1$ are used. Both resonators $S_1$ and $P_1$ generate longitudinal two-times harmonic oscillation, and are inserted, respectively, into series and parallel branches of a ladder-type circuit.

In accordance with the present invention, ladder-type piezo-electric filters are provided with rectangular piezo-resonators. In each piezo-resonator used in a series branch, for example, the resonators S in FIG. 1, one of or both of the opposite electrodes are divided into a certain number of divisional electrodes so as to generate a predetermined high harmonic oscillation. A plurality of piezo-electric regions sectioned by the divided opposite electrodes are polarized in the same direction.

In each piezo-resonator used in the parallel branches, for example, the resonators P in FIG. 1, one of the opposite electrodes is divided into a certain number of divisional electrodes so as to generate a predetermined high harmonic oscillation. A plurality of piezo-electric regions sectioned by the divisional opposite electrodes are alternately reversely polarized and the divisional electrodes are bridged over with conductors.

A further feature of the ladder-type piezo-electric filter, according to the present invention, is that the width dimension of the series-branch piezo-resonators is different from that of the parallel-branch piezo-resonators.

Each of the rectangular piezo-electric elements is characterized in that it operates at a frequency not lower than 1 MHz. Further, when the with of the series-branch piezo-resonator differs from that of the parallel-branch piezo-resonator, spurious frequencies due to lateral resonance are shifted from each other and thereby cancel each other. Thus, spurious frequencies are reduced.

Figure 2A:
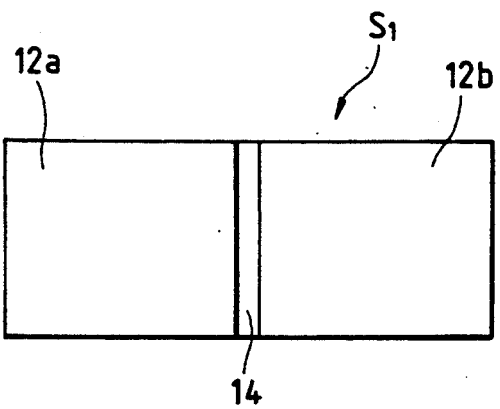
FIGS. 2A and 2B are plan and cross-section views showing a rectangular piezo-resonator which is to be inserted into a series branch of the ladder-type circuit of FIG. 1 and which utilizes a two-times harmonic of longitudinal oscillation.
Figure 2B:
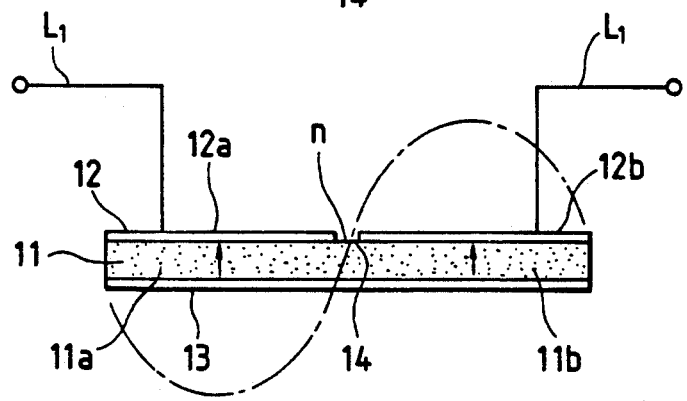

FIG. 2 illustrates the configuration of one rectangular piezo-resonator $S_1$ to be inserted into the series branch. In $S_1$, opposite electrodes 12 and 13 are formed by silver printing, or the like, on the front and back parallel surfaces of a rectangular piezo-electric ceramic element 11, the transverse size of which should not be larger than 7/10 times the longitudinal size. One of the opposite electrodes, electrode 12 on the front surface in this case, is halved into divisional electrodes 12a and 12b by an isolating slit 14. Slit 14 is formed at the position corresponding to a node point n of the waveform (shown by a one-dot chained line) of two-times harmonic oscillation. Two piezo-electric regions 11a and 11b, one (11a) of which is between the divisional electrode 12a and the back surface electrode 13, and the other (11b) of which is between the divisional electrode 12b and the back surface electrode 13, are subject to polarization treatment in the same direction relative to thickness of the resonator as indicated by the arrows. Further, the divisional electrodes 12a and 12b are connected to an input-output line $L_1$ of the ladder-type circuit.

Figure 3A:
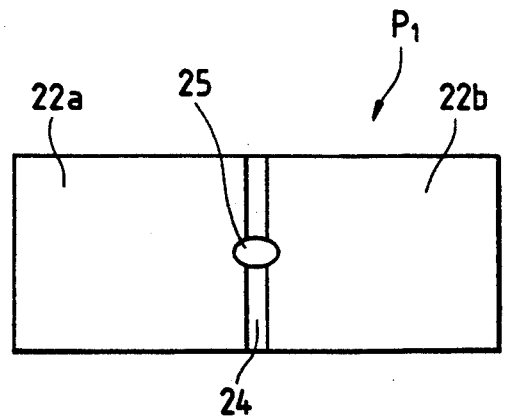
FIGS. 3A and 3B are plan and cross-section views showing a rectangular piezo-resonator which is to be inserted into a parallel branch of the ladder-type circuit of FIG. 1 and which utilizes a two-times harmonic of longitudinal oscillation.
Figure 3B:
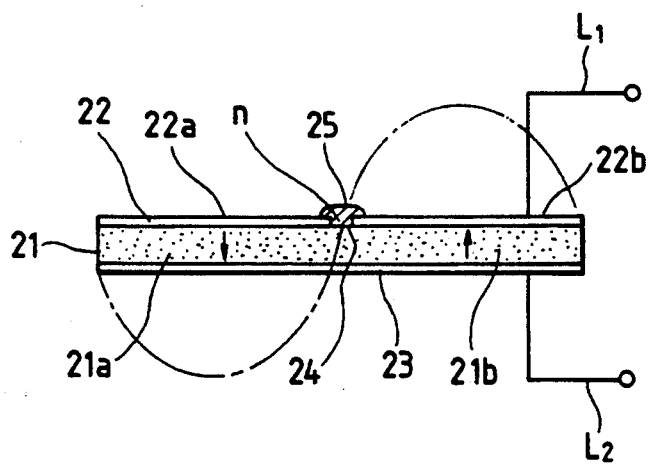

FIG. 3 illustrates the configuration of one rectangular piezo-resonator $P_1$ to be inserted into the parallel branch. In $P_1$, one of the opposite parallel electrodes 22 and 23 of a rectangular piezo-electric ceramic element 21, electrode 22 in this case, is halved by an isolating slit 24 formed at the position corresponding to a node point n of two-times harmonic oscillation. Further, the two piezo-electric regions 21a and 21b, one (21a) of which is between divisional electrode 22a and the back surface electrode 23, and the other (21b) of which is between divisional electrode 22b and the back surface electrode 23, are subject to polarization treatment in opposite directions of thickness as indicated by the arrows. The divisional electrodes 22a and 22b are bridged by a suitable conductor 25, such as conductive paint or the like, and are commonly connected to the input-output line $L_1$ of the ladder-type circuit. The back surface electrode 23 is connected to a ground line $L_2$.

Figure 4:
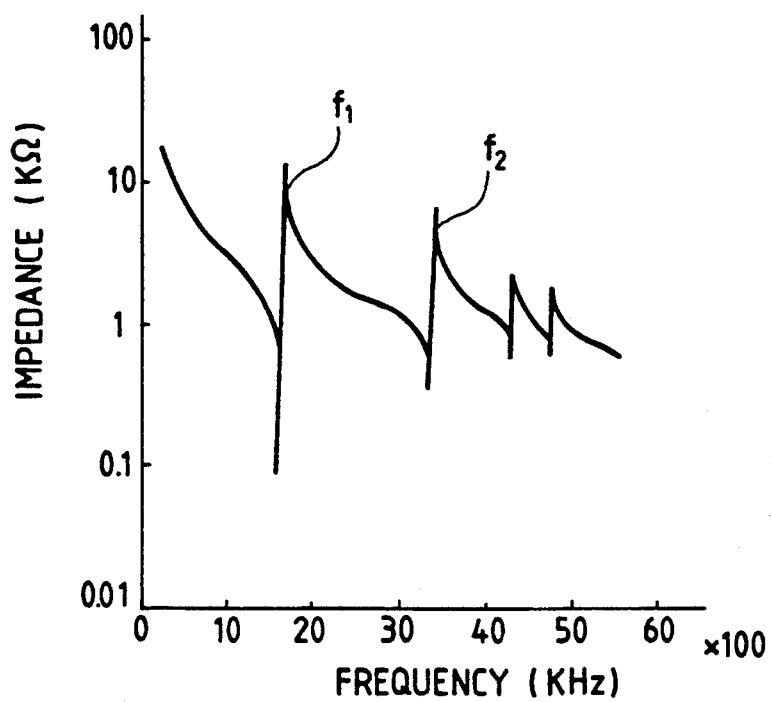
FIG. 4 is a graph showing the impedance characteristic of each of the series and parallel piezo-resonators.

The piezo-electric ceramic elements 11 and 21, that respectively constitute resonators $S_1$ and $P_1$, have dimensions selected at 2.0 mm (length)×0.5 mm (width)×0.25 mm (thickness) and are made, for example, of lead zirconate titanate. The isolating slits 14 and 24, that respectively halve front surface electrodes 12 and 22, are of 0.3 mm width. The piezo-electric regions 11a, 11b, 21a and 21b were polarized in the predetermined directions with a DC voltage of 3 kV/mm. FIG. 4 demonstrates the results of measurements of the impedance characteristic of the series and parallel resonators $S_1$ and $P_1$. The resonance $f_l$ of large resonance impedance was caused at the frequency 1.7 MHz of an aimed two-times harmonic.

Figure 5:
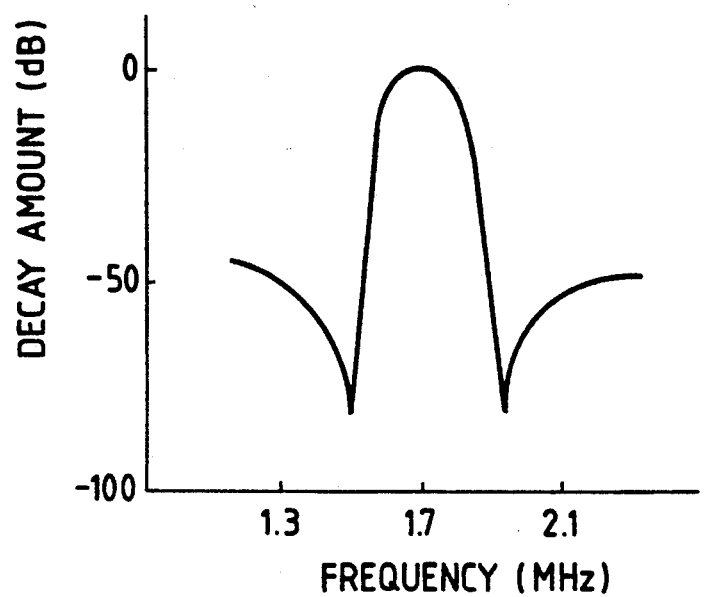
FIG. 5 is a graph showing the filter characteristic of the ladder-type circuit using series and parallel piezo-resonators according to the present invention.

Further, four series resonators $S_1$, in which the resonance frequency was set at 1.7 MHz and the electrostatic capacity was set at 25 pF, and four parallel resonators $P_1$, in which the antiresonance frequency was set at 1.65 MHz and the electrostatic capacity was set at 90 pF, were wired so as to constitute the ladder-type circuit of FIG. 1. The input-output resistors $R_1$ and $R_2$ were connected so that $R_1=R_2=2k\Omega$. FIG. 5 illustrates the measured filter characteristic of the resultant circuit.

Although the above embodiments have been described using the series and parallel resonators $S_1$ and $P_1$ which generate two-times harmonic oscillation, rectangular resonators which generate three-times or more harmonic may be used for the same purpose. FIGS. 6-10 exhibit the necessary modifications.

Figure 6A:
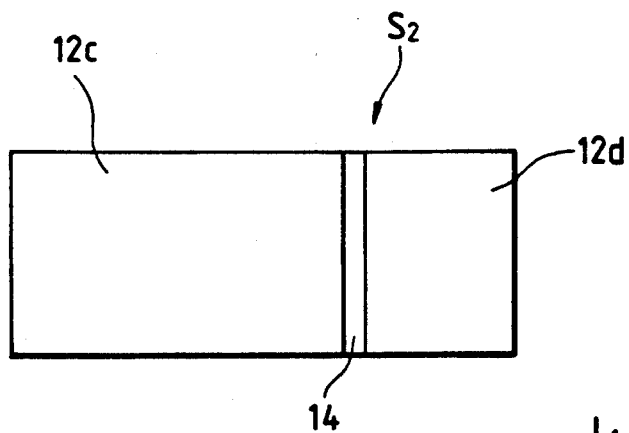
FIGS. 6A and 6B are plan and cross-section views showing a rectangular piezo-resonator which is to be inserted into a series branch of the ladder-type circuit of FIG. 1 and which utilizes a three-times harmonic of longitudinal oscillation.
Figure 6B:
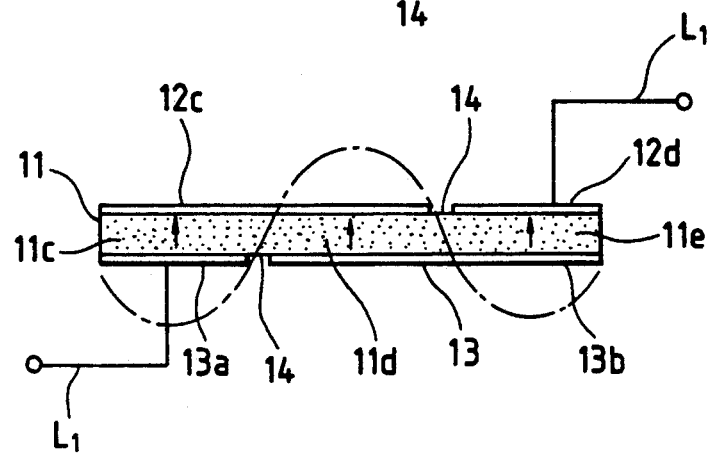
Figure 7A:
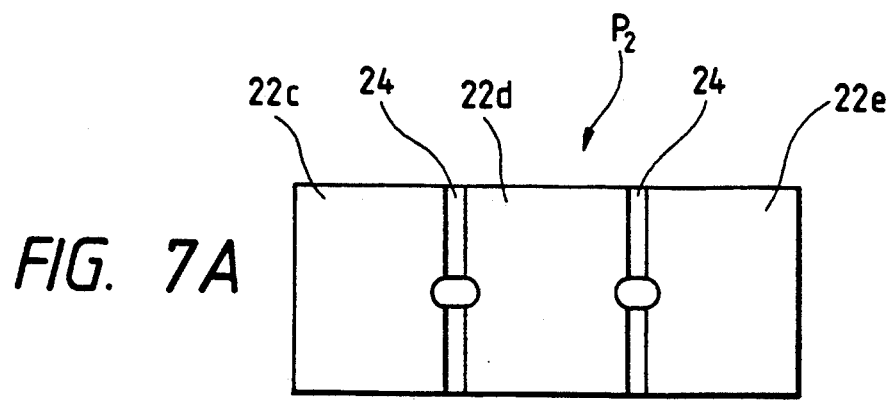
FIGS. 7A and 7B are plan and cross-section views showing a rectangular piezo-resonator which is to be inserted into a parallel branch of the ladder-type circuit of FIG. 1 and which utilizes a three-times harmonic of longitudinal oscillation.
Figure 7B:
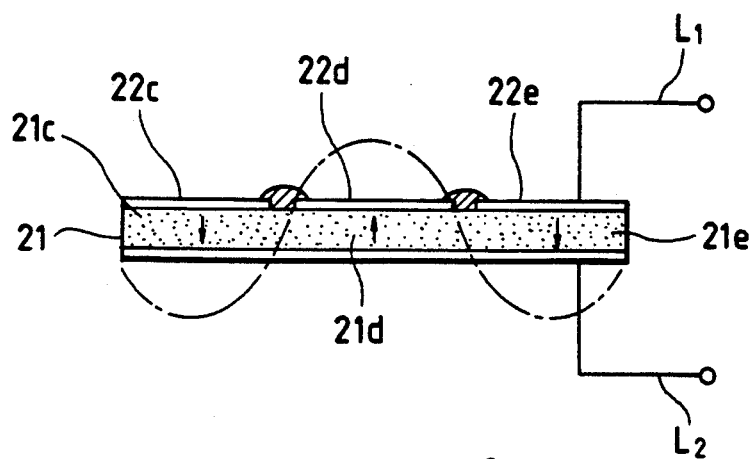
Figure 8A:
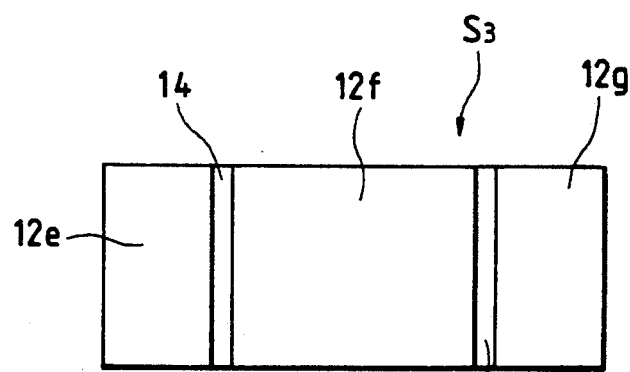
FIGS. 8A and 8B are plan and cross-section views showing a rectangular piezo-resonator which is to be inserted into a series branch of the ladder-type circuit of FIG. 1 and which utilizes a four-times harmonic of longitudinal oscillation.
Figure 8B:
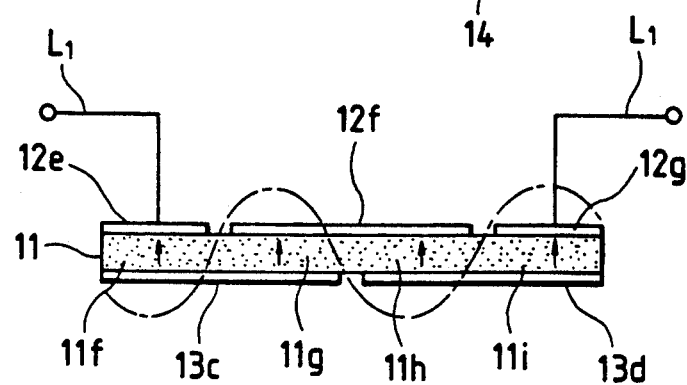
Figure 9A:
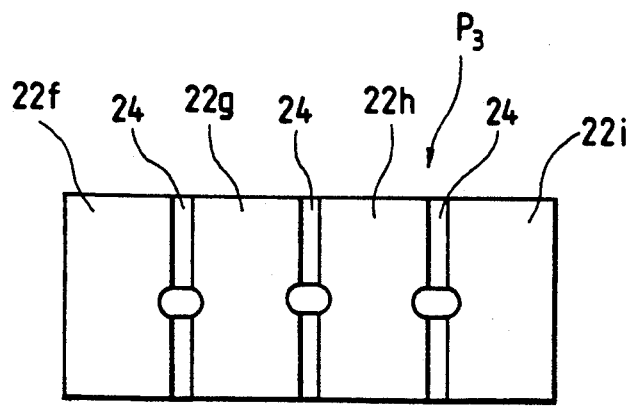
FIGS. 9A and 9B are plan and cross-section views showing a rectangular piezo-resonator which is to be inserted into a parallel branch of the ladder-type circuit of FIG. 1 and which utilizes a four-times harmonic of longitudinal oscillation.
Figure 9B:
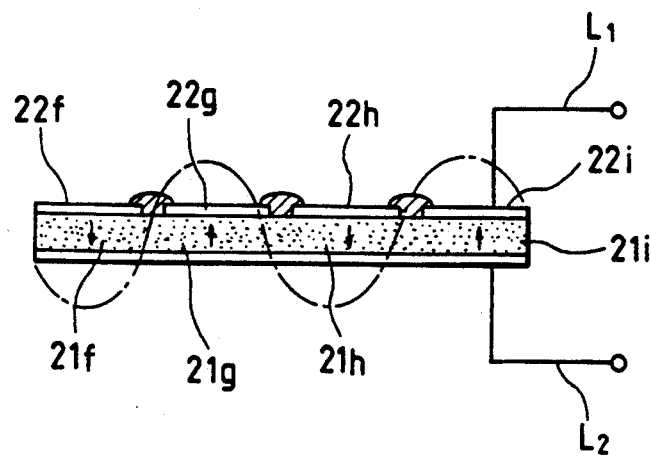

FIGS. 6 and 7 respectively illustrate series and parallel resonators $S_2$ and $P_2$ which utilize three-times harmonic oscillation. FIGS. 8 and 9 similarly illustrate series and parallel resonators $S_3$ and $P_3$ which utilize four-times harmonic oscillation. Lastly, FIGS. 10 and 11 respectively represent series and parallel resonators $S_4$ and $P_4$ which utilize five-times harmonic oscillation.

In the series resonator $S_2$, as shown in FIG. 6, isolating slits 14 define the positions of node points n corresponding to the higher harmonic oscillation. The slits are formed on the front and back surfaces of the electrodes. The respective piezo-electric regions are connected in series to an input-output line $L_1$.

Figure 10A:
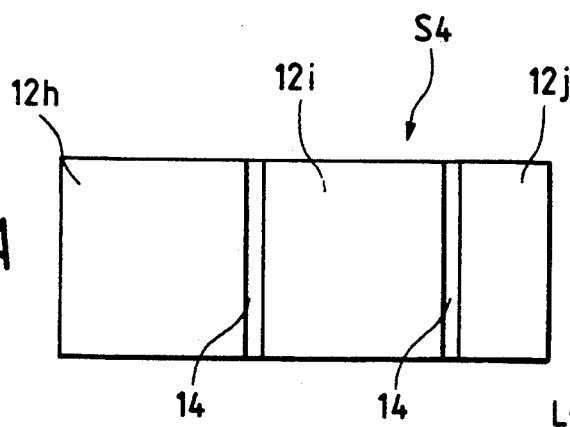
FIGS. 10A and 10B are plan and cross-section views showing a rectangular piezo-resonator which is to be inserted into a series branch of the ladder-type circuit of FIG. 1 and which utilizes a five-times harmonic of longitudinal oscillation.
Figure 10B:
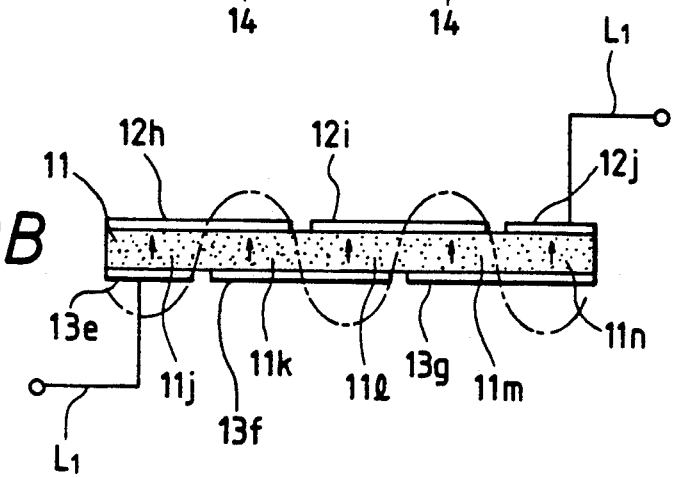

In the series resonators $S_2$, $S_3$, and $S_4$, illustrated respectively in FIGS. 6, 8, and 10, the isolating slits 14 divide the respective front surface electrodes 12 into divisional electrodes 12c–12j. The back surface electrodes 13 are divided by isolating slits 14 into divisional electrodes 13a–13g. The result is the formation of piezo-electric regions 11c–11n, whose directions of polarization are shown by the arrows.

In the parallel resonators $P_2$, $P_3$, and $P_4$, illustrated respectively in FIGS. 7, 9, and 11, the front surface electrodes 22 are divided by isolating slits 24 into divisional electrodes 22c–22n. The resultant piezo-electric regions 21c–21n are polarized in the directions indicated by the arrows.

All other reference numerals used in FIGS. 6–11 designate the same portions as those in FIGS. 2 and 3.

FIG. 4, which exhibits the impedance characteristic of the rectangular resonator, further illustrates the lateral resonance frequency, or spurious frequency, $f_2$ that is generated in addition to the longitudinal main resonance frequency $f_1$. Because the lateral resonance frequencies of the respective resonators are substantially equal to each other, the problem is presented that when using a plurality of resonators having the same width, resonance is generated producing an intense spurious wave. However, when the width of the respective rectangular resonators is different from each other, the lateral resonance frequencies are shifted, causing them to interfere or cancel each other and, thereby, suppress the spurious frequencies.

As described above, a ladder-type piezo-electric filter can be obtained that operates at a predetermined frequency not lower than 1 MHz and utilizes rectangular piezo-resonators with a high harmonic of longitudinal oscillation. The division of the opposite electrodes of the piezo-resonators into a certain number of divisional electrodes and the polarization of the resultant piezoelectric regions generate a high harmonic of longitudinal oscillation. Further, when the width of the rectangular piezo-resonators is made different from each other, it is possible to provide a filter improved against spurious frequencies. Because the rectangular resonators are smaller than square resonators and utilize less material, it is possible to obtain a small-size, inexpensive and high frequency ladder-type piezo-electric filter capable of more simplified handling, production, and assembly.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A ladder-type piezo-electric filter circuit, comprising:
   a first set of piezo-resonators connected to each other in series, each of the first set of piezo-resonators including:
      a rectangular piezo-electric element having an oscillation mode in a longitudinal direction and having a first surface and an opposing second surface and including at least two regions each polarized in the same direction transverse to the first surface;
      a first electrode on the first surface;
      a second electrode on the second surface and divided into divisional electrodes by at least one slit;
   a second set of piezo-resonators connected to each other in parallel, each of the second set of piezo-resonators including:
      a rectangular piezo-electric element having an oscillation mode in a longitudinal direction and having a first surface and an opposing second surface and including at least two regions each polarized in alternately opposite directions transverse to the first surface;
      a first electrode on the first surface;
      a second electrode on the second surface and divided into divisional electrodes by at least one slit; and
      conductors bridging the divisional electrodes of the second set of piezo-resonators.

2. A ladder-type piezo-electric filter as recited in claim 1, wherein the second electrode of each piezo-resonator in the first set and each piezo-resonator in the second set is divided into two divisional electrodes by one slit.

3. A ladder-type piezo-electric filter as recited in claim 2, wherein each slit is formed at the position corresponding to the node point of a waveform of two-times harmonic oscillation.

4. A ladder-type piezo-electric filter as recited in claim 1, wherein:
   the first electrode and the second electrode of each piezo-resonator in the first set is divided into two divisional electrodes by one slit; and
   the second electrode of each piezo-resonator in the second set is divided into three divisional electrodes by two slits.

5. A ladder-type piezo-electric filter as recited in claim 4, wherein the slits are formed at the positions corresponding to the node points of a waveform of three-times harmonic oscillation.

6. A ladder-type piezo-electric filter as recited in claim 1, wherein:
   the first electrode of each piezo-resonator in the first set is divided into two divisional electrodes by one slit;
   the second electrode of each piezo-resonator in the first set is divided into three divisional electrodes by two slits; and
   the second electrode of each piezo-resonator in the second set is divided into four divisional electrodes by three slits.

7. A ladder-type piezo-electric filter as recited in claim 6, wherein the slits are formed at the positions corresponding to the node points of a waveform of four-times harmonic oscillation.

8. A ladder-type piezo-electric filter as recited in claim 1, wherein:
   the first electrode and the second electrode of each piezo-resonator in the first set is divided into three divisional electrodes by two slits; and
   the second electrode of each piezo-resonator in the second set is divided into five divisional electrodes by four slits.

9. A ladder-type piezo-electric filter as recited in claim 8, wherein the slits are formed at the positions corresponding to the node points of a waveform of five-times harmonic oscillation.

10. A ladder-type piezo-electric filter as recited in claim 1, wherein the width of each piezo-resonator in the first set differs from that of each piezo-resonator in the second set.

* * * * *